United States Patent
Joge et al.

(10) Patent No.: US 7,495,167 B2
(45) Date of Patent: Feb. 24, 2009

(54) SILICON SOLAR CELL AND PRODUCTION METHOD THEREOF

(75) Inventors: Toshio Joge, Hitachi (JP); Ichiro Araki, Hitachinaka (JP); Tomonori Hosoya, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 569 days.

(21) Appl. No.: 10/960,517

(22) Filed: Oct. 8, 2004

(65) Prior Publication Data
US 2005/0133084 A1  Jun. 23, 2005

(30) Foreign Application Priority Data
Oct. 10, 2003  (JP) .............................. 2003-351473

(51) Int. Cl.
*H01L 31/0224* (2006.01)
*H01L 31/18* (2006.01)

(52) U.S. Cl. ..................... 136/249; 136/243; 136/261

(58) Field of Classification Search ............... 136/244, 136/256; 437/11; 438/98
See application file for complete search history.

(56) References Cited

U.S. PATENT DOCUMENTS

| | | | |
|---|---|---|---|
| 4,152,824 A * | 5/1979 | Gonsiorawski | 438/98 |
| 4,828,628 A | 5/1989 | Hezel et al. | |
| 5,151,377 A * | 9/1992 | Hanoka et al. | 438/98 |
| 5,178,685 A * | 1/1993 | Borenstein et al. | 136/244 |
| 5,360,748 A * | 11/1994 | Nadahara et al. | 438/476 |
| 5,990,413 A * | 11/1999 | Ortabasi | 136/244 |
| 6,071,437 A * | 6/2000 | Oya | 252/514 |
| 6,180,869 B1 * | 1/2001 | Meier et al. | 136/256 |

FOREIGN PATENT DOCUMENTS

| | | |
|---|---|---|
| DE | 3536299 A1 | 4/1987 |
| EP | 0 851 511 A1 | 7/1998 |
| JP | 09293889 A * | 11/1997 |
| JP | A-10-144943 | 5/1998 |
| JP | A-2000-188409 | 7/2000 |
| JP | 2002043597 A * | 2/2002 |

OTHER PUBLICATIONS

English Translation of Takahashi et al., "Solar Battery Element", JP 09-293889, Nov. 1997.*

(Continued)

*Primary Examiner*—Alexa D Neckel
*Assistant Examiner*—Miriam Berdichevsky
(74) *Attorney, Agent, or Firm*—Antonelli, Terry, Stout & Kraus, LLP.

(57) ABSTRACT

It is an object of the present invention to provide a silicon solar cell with $n^+pp^+$ BSF structure using solar grade silicon substrate, having a life time close to the initial level of the substrate.

The solar cell of the present invention is produced by a back side boron diffusion step for diffusing boron on a back side of the substrate, a front side phosphorus diffusion step for diffusing phosphorus on a front side of the substrate, a low-temperature annealing step for annealing the substrate at 600° C. or lower for 1 hour or more, and an electrode firing step carried out at a peak temperature of 700° C. or lower for 1 minute or less, carried out in this order.

11 Claims, 4 Drawing Sheets

OTHER PUBLICATIONS

English Translation of Owada et al. JP 2002-043597.*

T. Joge, et al., "Low-Temperature Boron Gettering for Improving the Carrier Lifetime in Fe-Contaminated Bifacial Silicon Solar Cells with $n^+pp^+$ Back-Surface-Field Structure", *Japanese Journal of Applied Physics*, vol. 42 (2003) pp. 5397-5404.

T. Joge, et al., "A Combination of Boron Gettering and Phosphorous Gettering in Fe-Contaminated $n^+pp^+$ Bifaicial Silicon Cells", 3rd World Conference on Photovoltaic Energy Conversion, May 11-18, 2003, Osaka, Japan, pp. 1455-1458.

German Official Action dated Jul. 27, 2007, for Application No. DE 10 2004 049 160.7.

* cited by examiner (A)

(B)

SILICON SOLAR CELL AND PRODUCTION METHOD THEREOF

The present application claims priority to Japanese Patent Application No. JP 2003-351473 filed on Oct. 10, 2003.

FIELD OF THE INVENTION

The present invention relates to a silicon photovoltaic solar cell and production method thereof.

BACKGROUND OF THE INVENTION

A silicon solar cell (mono-facial cell) by a conventional technique comprises a p-type silicon substrate, in which an $n^+$ layer is formed by phosphorus diffusion and a grid-shape silver electrode in this order on the front side and with aluminum electrode over the entire back side, where these electrodes are formed by printing and firing process. More specifically, aluminum paste is printed and then fired at around 800° C., which diffuses the aluminum atoms into the silicon substrate to form the $p^+$ layer on the back side. This $p^+$ layer works as a back surface field (hereinafter referred to as BSF), which improves cell performance. At the same time, phosphorus gettering takes place while phosphorus is being diffused, and aluminum gettering takes place while the electrode is being fired, to improve life time of bulk silicon and cell performance. This conventional technique is disclosed in, for example, Patent document 1 below.

A bifacial cell with both sides serving as the photosensitive surfaces (photosensitive cell on both sides) is another technique, where a p-type silicon substrate is coated with an n+ layer formed by phosphorus diffusion to provide a $n^+p$ junction on the front side, and with a $p^+$ BSF formed by boron diffusion and grid-shape electrode as a planar electrode on the back side. This type of bifacial cell has a low carrier life time, therefore the conversion efficiency when the back side is illuminated is around 60% or less to that when the front side is illuminated.

In a grid-shape electrode provided with finger and busbar electrodes in a solar cell by a conventional technique, the finger electrodes are arranged at the same interval of 120 to 140 µm until the electrode comes into contact with the busbar electrode.

(Patent Document 1): JP-A-10-144943 (Paragraphs 0026, 0027 and 0030).

BRIEF SUMMARY OF THE INVENTION

A silicon solar cell with $n^+pp^+$ structure produced by phosphorus and boron diffusion by a conventional technique, is contaminated with Fe not only in the silicon substrate manufacturing process but also in cell production steps. At the same time, treating p-type silicon by boron diffusion reduces its bulk effective life time to around 10 µs, making it difficult to secure sufficient cell performance, because the reduced life time is recovered to a limited extent by phosphorus gettering alone, which accompanies phosphorus diffusion. Moreover, heat treatment in the electrode firing step also reduces its life time.

The above-described cell of another technique with both sides serving as the photosensitive surfaces has a short life time, with conversion efficiency in particular while the back side is irradiated with light being low at 50 to 60% of efficiency while the front side is irradiated.

A glass-glass module using conventional mono-facial cells has a disadvantage related to outer appearances for the service with the back side showing up, because of the aluminum electrode on the cells back side being uneven brownish red in color and presence of the silver busbar electrodes. Moreover, the above-described conventional mono-facial cell is difficult to use thinner substrate, because it is coated with an aluminum electrode over the entire back side and tends to suffer cracking, including microcracking, when formed into a thinner substrate.

The grid electrode for the conventional cells is composed of finger and busbar electrodes formed by printing and firing process. The finger electrode tends to dwindle at the base on the busbar electrode, when the grid electrode is formed finely, with the result that resistance increases at that portion, at which current density increases, to cause problems, e.g., deteriorated cell performance and production yield.

It is an object of the present invention to provide a solar cell having an $n^+pp^+$ BSF structure with the $p^+$ layer, formed by boron diffusion, exhibiting a life time close to that of the initial level of the substrate. It is another object of the present invention to provide a production method of the solar cell of high efficiency, with the photosensitive cell(s) on one or both sides.

The method of the present invention for production of the solar cell first carries out boron diffusion, which deteriorates cell life time, on the cell back side, and then phosphorus diffusion on the cell front side, i.e., opposite to the boron diffusion side, to recover silicon substrate life time deteriorated as a result of boron diffusion by phosphorus gettering accompanying phosphorus diffusion. Then, it anneals the cell at a low temperature of around 600° C. or lower for an hour-order time to further recover life time by low-temperature born gettering, where Fe of a Fe—B pair, known as a life time killer and present in the element-activated region in the substrate with $Fe^+$ and B- pairing with each other, is gettered in the $p^+$ region in the boron diffusion layer as the gettering site. Then, it simultaneously fires the electrodes on both sides at a low temperature of around 700° C. or lower in the electrode calcining step as the final heat treatment step for the solar cell production process, to secure the life time recovered by the low-temperature born gettering.

Other objects, features and advantages of the invention will become apparent from the following description of the embodiments of the invention taken in conjunction with the accompanying drawings.

DESCRIPTION OF REFERENCE NUMERALS

Figure 1:
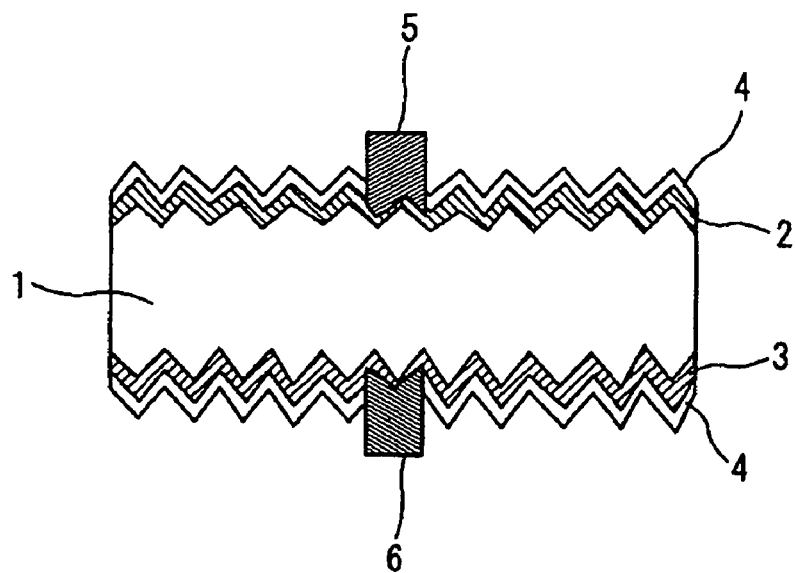
FIG. 1 illustrates a cross-sectional structure of the solar cell produced in Example 1.

1 Silicon substrate
2 $n^+$ layer 3 p+ layer
4 Silicon oxide (SiO$_2$) film
5 Front electrode
6 Back electrode
7 n+pp+-diffused substrate
8 Busbar electrode
9, 10 Finger electrode
11 Finger electrode base
12 n+p-diffused substrate
13 Aluminum electrode

DETAILED DESCRIPTION OF THE INVENTION

The embodiments of the present invention are described by referring to the attached drawings.

EXAMPLE 1

FIG. 1 illustrates a cross-sectional structure of the solar cell produced in Example 1, where the silicon substrate 1 may be of p- or n-type. The solar cell is described here taking a p-type substrate as an example.

The solar cell of Example 1 comprises the silicon substrate 1 coated with the n+ layer 2 on the front side and p+ layer 3 on the back side, the former being formed by phosphorus diffusion and the latter by boron diffusion, where the n+ layer 2 and p layer of the silicon substrate 1 form the p-n junction while the p+ layer 3 forms a BSF. Each of the n+ layer 2 and p+ layer 3 is coated with the silicon oxide (SiO$_2$) film 4.

Figure 2:
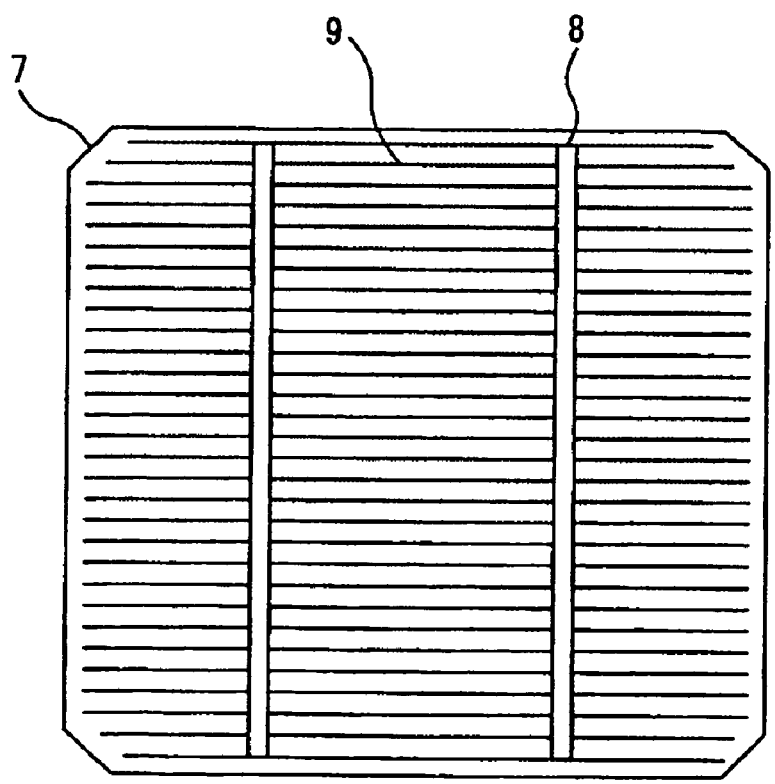
FIG. 2 illustrates a grid-shape electrode of the solar cell produced in Example 1.

The n+pp+-diffused substrate of BSF structure is coated with the respective front electrode 5 as the cathode on the front side and back electrode 6 as the anode on the back side. The grid-shape electrode for the silicon solar cell of Example 1 is composed of the busbar electrodes 8 and finger electrodes 9, as illustrated in FIG. 2, where the narrower finger electrodes extend from each of the wider busbar electrodes 8.

Figure 3:
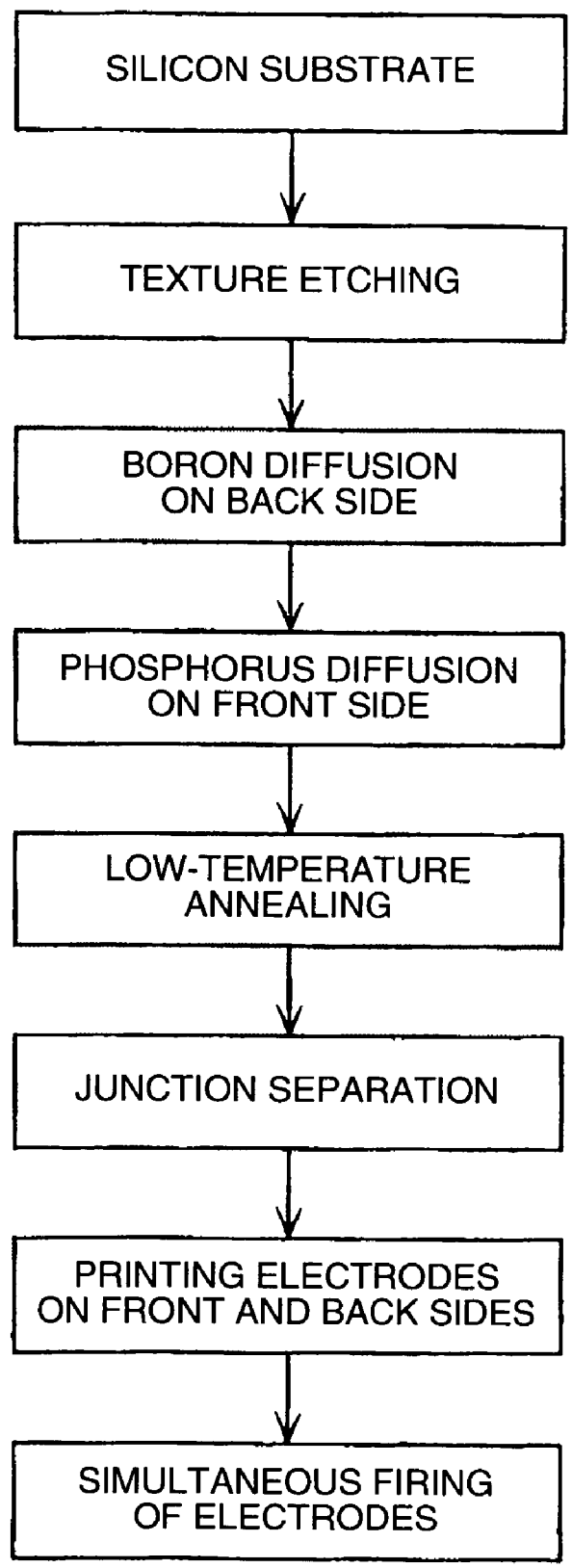
FIG. 3 illustrates a process flow for producing the solar cell in Example 1.

FIG. 3 illustrates a process flow for producing the solar cell having n+pp+ BSF structure in Example 1. The inventors of the present invention have confirmed, after having extensively conducted tests with a number of samples, that a bulk life time of a silicon substrate decreases to around 10 μs, when treated by boron diffusion.

The method adopted in Example 1 carries out a texture-etching step of a substrate, and then a boron diffusion step for diffusing boron on the back side, and then a phosphorus diffusion step for diffusing phosphorus on the front side, and then low-temperature annealing, in this order, as illustrated in FIG. 3.

Example 1 recovers life time, greatly deteriorated by the boron diffusion on the back side, to a level close to the initial life time of the substrate, by a combination of (1) phosphorus gettering by the phosphorus diffusion and (2) low-temperature boron gettering by the low-temperature annealing, to realize the n+pp+-diffused BSF substrate of long life time.

The low-temperature boron gettering, on the other hand, is an annealing step carried out in an inert gas atmosphere, represented by a nitrogen gas atmosphere, at a low temperature of around 600° C. or lower for an hour-order time of 1 hour or more.

It is known that the lattice-substituted B$^-$ and interstitial Fe$^+$ form a Fe—B pair in a Fe-contaminated p-type silicon substrate, the reaction being in equilibrium at a given temperature. This Fe—B pair, having a large capturing cross-section, works as a life time killer. The low-temperature annealing getters the Fe which penetrates into and contaminates the interstitial space in the p layer in the element-activated region with the p+ layer formed by the boron diffusion as the gettering site, to recover life time.

Figure 4:
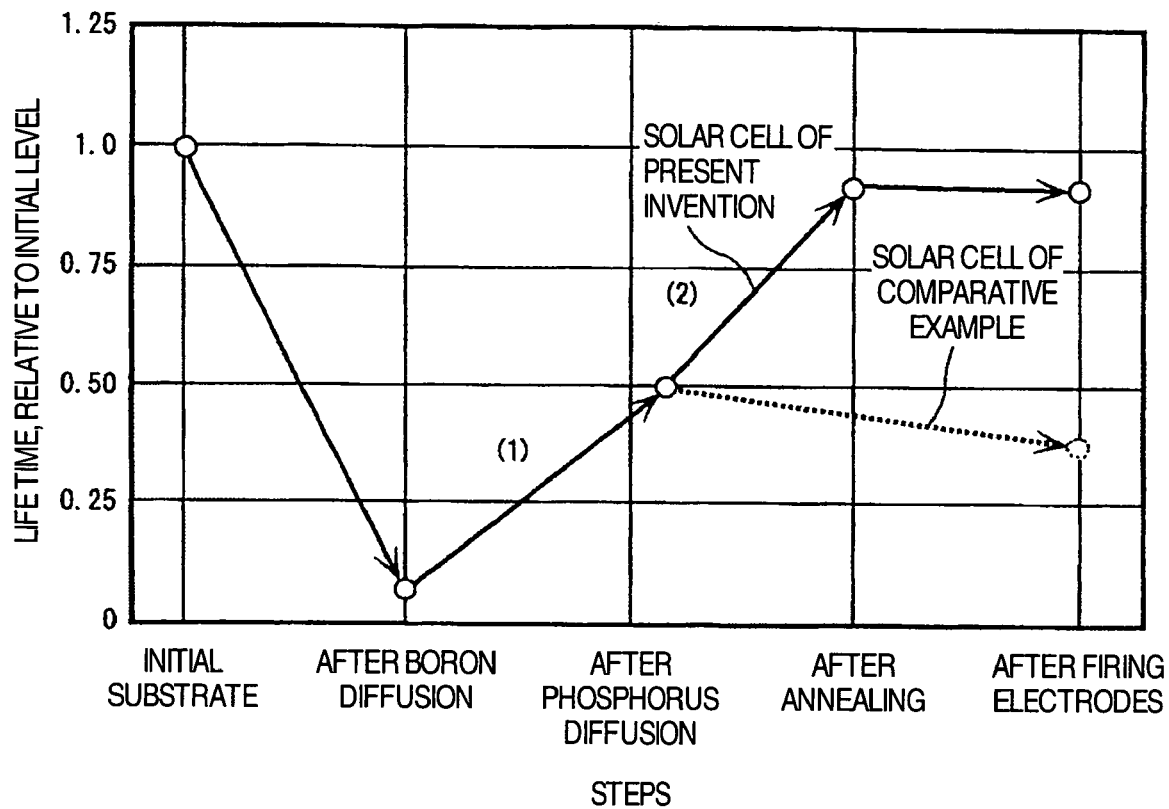
FIG. 4 illustrates the representative example of changed silicon substrate life time after each heat treatment step for producing the solar cell in Example 1.

FIG. 4 illustrates a representative example of the bulk life time recovery of the substrate by the method of Example 1, based on the test results. As shown, life time greatly deteriorated by the boron diffusion is recovered to 75% or more (85% or more in the case shown in FIG. 4) of the initial substrate life time by a combination of (1) phosphorus gettering and (2) low-temperature boron gettering, as illustrated by the solid lines in FIG. 4.

The silicon solar cell with n+pp+ BSF structure, produced in Example 1, is then coated with the electrodes on the front and back sides. This step involves printing of the electrodes on the front and back sides, and subsequent simultaneous firing of these electrodes in FIG. 3. Example 1 set a peak firing temperature at around 700° C. or lower and firing time at the peak temperature at 1 minute or less, to simultaneously fire the electrodes on the front and back sides. The cell kept 75% or more (85% or more in the case shown in FIG. 4) of the initial substrate life time, even after it was exposed to the firing conditions.

FIG. 4 also illustrates changed life time of a cell produced in Comparative Example, which was coated with electrodes at a higher temperature of around 800° C. without having been treated by low-temperature annealing. In this case, cell life time was deteriorated to 50% or less (40% or less in the case shown in FIG. 4) of the initial substrate life time. The deteriorated life time of the cell produced in Comparative Example resulted from the higher-temperature heat treatment, which caused the reverse reaction of the low-temperature boron gettering.

As discussed above, Example 1 can give an n+pp+-diffused BSF substrate of high cell performance, which keeps effective life time in the element-activated region close to the initial substrate life time, even when subjected to a series of heat treatment steps necessary for boron and phosphorus diffusion.

The silicon solar cell with n+pp+ BSF structure produced in Example 1 can take irradiances also from the back side by virtue of the grid-shape electrode formed on the back side, similar to that on the front side (see FIG. 2). It is coated with the electrodes on both sides, and can efficiently receive irradiances entering the both sides, because of a small electrode area of around 6% of the total surface area. It has a bifaciliality, i.e., ratio of conversion efficiency on the rear side to that on the front side, of 80% or more when a CZ substrate of solar cell grade is used.

The solar cell of Example 1, coated with the electrodes illustrated in FIG. 2, has the photosensitive surface on each side. Irradiance entering the back side generates electrons massively in the surface vicinity, around 90% of the total at a depth up to 10 μm from the surface, to enhance photoelectric conversion even when the back side is irradiated with light, because of long life time and thin cell to increase proportion of the carriers reaching the p-n junctions, in spite of increased necessary distance for which the generated electrons diffuse to reach these junctions, which are present in the front side vicinity, at a depth of 0.3 μm from the surface in many solar cells.

EXAMPLE 2

Figure 5:
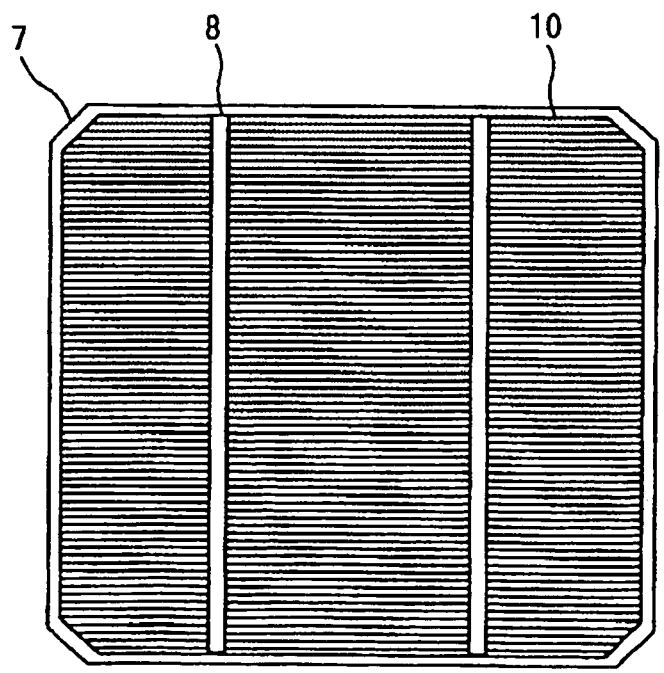
FIG. 5 illustrates an electrode pattern on the back side of the solar cell produced in Example 2.

The solar cell with n+pp+ BSF structure was produced in Example 2 in the same manner as in Example 1, except that it was coated with the grid-shape electrode, as illustrated in FIG. 2, on the front side, not expecting positive photosensitivity on the back side. Therefore, it differs from the cell produced in Example 2 only in that the electrode accounts for a larger area and is arranged more finely and tightly as shown at FIG. 5. In other words, area ratio of the grid-shape electrode on the front side to the front side surface is smaller than that of the grid-shape electrode on the back side to the back side surface.

Figure 6:
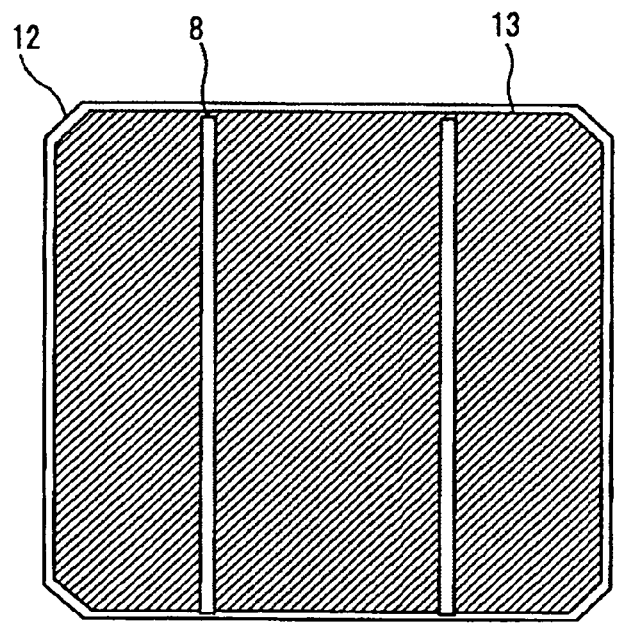
FIG. 6 illustrates an electrode pattern on the back side of a conventional solar cell.

A mono-facial cell by conventional technique, illustrated in FIG. 6, comprises the $n^+$p-diffused substrate 12 coated with the aluminum electrode 13 of uneven brownish red color over the entire back side. By contrast, the mono-facial cell of Example 2, illustrated in FIG. 5, comprises the $n^+pp^+$-diffused substrate 7 coated with the busbar electrodes 8 and finger electrodes 10 of better outer appearances on the back side, but not with an aluminum electrode over the entire back side. As a result, the cell is more resistant to warping or cracking, even when its thickness is reduced to 200 μm or less.

As discussed above, the mono-facial cell of Example 2 exhibits improved performance owing to the BSF, and also to improved life time of the carriers generated at a relatively deep area of the cell, which contributes to improved cell performance, in particular fill factor. Moreover, it can be coated with a fine silver electrode of better outer appearances on the back side.

EXAMPLE 3

Figure 7:
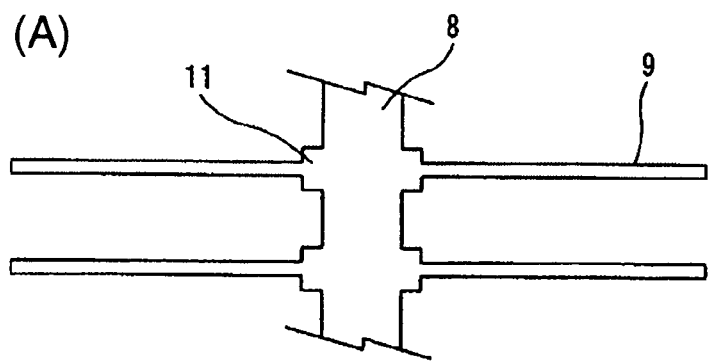
FIG. 7 illustrates the finger electrode base of the fine electrode for the solar cell produced in Example 3.
Figure 7:
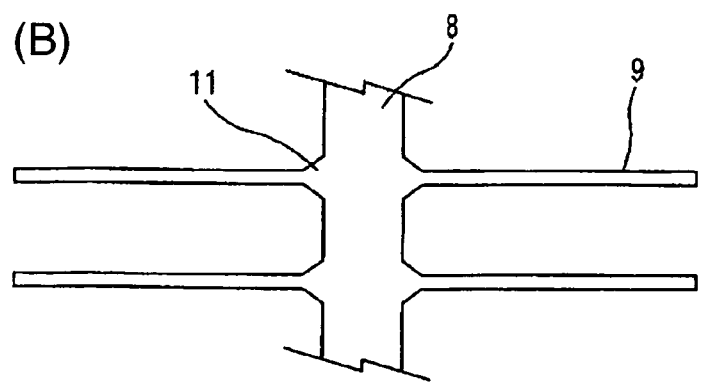

The solar cell was produced in the same manner as in Example 1 or 2, except that the fine finger electrodes 9 (width: 100 μm or less) were made thicker at the bases 11 on the busbar electrode 8, as illustrated in FIG. 7. The width of the busbar electrode 8 in the cell of Example 3 is at least 10 times wider than that of the finger electrode 9 and is 1 to 3 mm. The wider base 11 is rectangular (FIG. 7 (A)) or triangular (FIG. 7(B)), and the finger electrodes 9 are made 2 to 4 times wider in width at a portion around 1 mm from the base 11. The width of the finger electrode 9 may be made wider in the section from the base 11 to 0.3 to 2 times of the busbar electrode width. The solar cell of Example 3 has improved cell performance, because the finger electrodes 9 for the grid-shape electrode are made finer to increase number of the finger electrodes 9 and thereby to reduce series resistance of the cell.

As discussed above, Example 3 realizes a solar cell of high efficiency by eliminating the dwindled section in each of the finger electrodes at the base on the busbar electrode, even when they are designed to have a final width of 100 μm or less to reduce series resistance of the cell.

It should be further understood by those skilled in the art that although the foregoing description has been made on embodiments of the invention, the invention is not limited thereto and various changes and modifications may be made without departing from the spirit of the invention and the scope of the appended claims.

ADVANTAGES OF THE INVENTION

The present invention can realize an $n^+pp^+$ BSF type solar cell of high cell efficiency, with the photosensitive cell(s) on one or both sides, whose effective life time in the element-activated region can be recovered to, and kept at, a level close to the initial substrate life time, even when it is subjected to a series of heat treatment steps necessary for boron and phosphorus diffusion.

The invention claimed is:

1. A production method of silicon solar cell having an $n^+pp^+$ structure with a phosphorus-diffused $n^+$ layer formed on a first side of p-type silicon substrate and boron-diffused $p^+$ layer formed on a second side of said p-type silicon substrate, comprising the steps of:
    a back side boron diffusion step for diffusing-treating boron on a back side of the silicon substrate,
    a front side phosphorus diffusion step for diffusing phosphorus on a front side of the silicon substrate after the back side boron diffusion step,
    a low-temperature annealing step for annealing the substrate at 600° C. or lower for 1 hour or more after the front side phosphorus diffusion step,
    providing grid-shape electrodes on both the first side and the second side of the p-type substrate, and
    providing each of the grid-shape electrodes with a finger electrode and a busbar electrode,
    wherein the width of the finger electrode is narrower than 100 μm, the width of the busbar electrode is wider than 10 times of the width of the finger electrode, and the width of the finger electrode is made wider at a base portion at which the finger electrode and the busbar electrode are connected to each other.

2. A production method according to claim 1, further including the steps of:
    an electrode printing step after the low-temperature annealing step; and
    an electrode firing step after the electrode printing step,
    wherein the electrode firing step is to fire the electrode at a peak temperature of 700° C. or lower for a peak temperature period time of 1 minute or less.

3. A silicon solar cell made by the production method according to claim 1 or 2, having the $n^+pp^+$ structure with the phosphorus-diffused $n^+$ layer formed on the first side of the p-type silicon substrate and with the boron-diffused $p^+$ layer formed on the second side of the silicon substrate.

4. A silicon solar cell according to claim 3 which is provided with a bifacial cell.

5. A silicon solar cell according to claim 3, wherein the grid-shape electrode formed on the first side is different in shape from the grid-shape electrode formed on the second side.

6. A silicon solar cell according to claim 3, wherein an area ratio of the grid-shape electrode formed on the first side to the first side is smaller than an area ratio of the grid-shape electrode formed on the second side to the second side.

7. A production method according to claim 1, wherein said annealing step is performed in an inert gas atmosphere.

8. A production method according to claim 1, wherein said grid-shape electrodes provided on both the first side and the second side of the p-type substrate are fired at a peak firing temperature of 700° C. or lower.

9. A production method according to claim 8, wherein the grid-shape electrodes on both the first and second sides are simultaneously fired.

10. A production method according to claim 1, wherein a width of the finger electrode at the base portion is 0.3 to 2 times of the width of the busbar electrode.

11. A silicon solar cell made by the production method according to claim 10.

* * * * *